US008450155B2

(12) United States Patent
Huang et al.

(10) Patent No.: US 8,450,155 B2
(45) Date of Patent: May 28, 2013

(54) METHOD FOR INTRODUCING CHANNEL STRESS AND FIELD EFFECT TRANSISTOR FABRICATED BY THE SAME

(75) Inventors: Ru Huang, Beijing (CN); Quanxin Yun, Beijing (CN); Xia An, Beijing (CN); Xing Zhang, Beijing (CN)

(73) Assignee: Peking University (CN)

( * ) Notice: Subject to any disclaimer, the term of this patent is extended or adjusted under 35 U.S.C. 154(b) by 36 days.

(21) Appl. No.: 13/131,602

(22) PCT Filed: Apr. 1, 2011

(86) PCT No.: PCT/CN2011/072387
§ 371 (c)(1),
(2), (4) Date: May 26, 2011

(87) PCT Pub. No.: WO2012/003725
PCT Pub. Date: Jan. 12, 2012

(65) Prior Publication Data
US 2012/0032239 A1    Feb. 9, 2012

(30) Foreign Application Priority Data
Jul. 7, 2010   (CN) .......................... 2010 1 0219177

(51) Int. Cl.
*H01L 21/332*   (2006.01)
*H01L 21/335*   (2006.01)
*H01L 21/8232*  (2006.01)
*H01L 21/336*   (2006.01)
*H01L 21/8234*  (2006.01)

(52) U.S. Cl.
USPC ............ 438/135; 438/142; 438/197; 438/301

(58) Field of Classification Search
USPC .................. 257/288; 438/197, 163, 199, 783, 438/200, 360, 300, 301, 303, 322, 694, 135, 438/142
See application file for complete search history.

(56) References Cited

U.S. PATENT DOCUMENTS

2007/0015347 A1   1/2007  Mehta et al.
2008/0277740 A1*  11/2008 Tateshita ....................... 257/396

FOREIGN PATENT DOCUMENTS

| CN | 1830092   | 9/2006  |
| CN | 101866859 | 10/2010 |
| CN | 101924139 | 12/2010 |

OTHER PUBLICATIONS

International Search Report for PCT/CN2011/072387 dated Jun. 30, 2011.
International Search Report for PCT/CN2011/072387 dated Apr. 1, 2011.

* cited by examiner

*Primary Examiner* — Chuong A. Luu
(74) *Attorney, Agent, or Firm* — Bozicevic, Field & Francis LLP; Bret E. Field (57) ABSTRACT

The present invention relates to CMOS ultra large scale integrated circuits, and provides a method for introducing channel stress and a field effect transistor fabricated by the same. According to the present invention, a strained dielectric layer is interposed between source/drain regions and a substrate of a field effect transistor, and a strain is induced in a channel by the strained dielectric layer which directly contacts the substrate, so as to improve a carrier mobility of the channel and a performance of the device. The specific effects of the invention include: a tensile strain may be induced in the channel by using the strained dielectric layer having a tensile strain in order to increase an electron mobility of the channel; a compressive strain may be induced in the channel by using the strained dielectric layer having a compressive strain in order to increase a hole mobility of the channel. According to the invention, not only an effectiveness of the introduction of channel stress is ensued, but the device structure of the field effect transistor is also improved fundamentally, so that a capability for suppressing a short channel effect of the device is increased.

4 Claims, 8 Drawing Sheets

METHOD FOR INTRODUCING CHANNEL STRESS AND FIELD EFFECT TRANSISTOR FABRICATED BY THE SAME

FIELD OF THE INVENTION

The present invention relates to the field of field effect transistor logic devices and circuits in a CMOS ultra large scale integrated circuits (ULSI), and more particularly relates to a method for introducing channel stress and a field effect transistor fabricated by the same.

BACKGROUND OF THE INVENTION

As CMOS devices continue downscaling, effects of short channel effect and carrier mobility degradation effect of the devices become increasingly prominent. Demands on capabilities for suppressing the short channel effect and increasing the carrier mobility of the devices as required by development of the silicon-based MOS technology are getting pressing.

At present, in order to suppress the short channel effect of a device, conventional methods mainly include increasing a doping concentration of a substrate, adding a source/drain light doped region (LDD region), introducing a pocket structure, and the like; and meanwhile, an ultra-thin body structure can also be used in a silicon-on-insulator (SOI) device. However, increasing the doping concentration of the substrate will increase a threshold voltage of the device and decrease an on-state current of the device, adding the LDD region will increase a parasitic resistance of the device, and likewise, adding the pocket structure will cause an increase of a doping level of the substrate; and employing the ultra-thin body structure will cause an increase of the source/drain series resistance, and at the same time, will cause a great decrease of the channel carrier mobility and an overdriving capability of the device due to an increase of an interface scattering and a self-heating effect, and so on.

Meanwhile, when the dimensions of the device downscale to sub-100 nm regime, a deterioration of the short channel effect of the device makes it very difficult to implement a method for obtaining a better performance by further scaling. In order to relieve the problem caused by downscaling of the device, a strained silicon technology has been used to introduce a stress into the channel, and thus the carrier mobility of the channel and the device performance of a transistor are improved. Such a method has become indispensable and has been widely adopted in the field of microelectronics fabrication industry. The basic principle of the method is described as follows: a stress is introduced in a channel region of a transistor by means of a structure, a material and a process design of the device, so that a lattice structure of the channel portion of the substrate is changed, thereby a mobility of carriers in the channel is increased.

Figure 1:
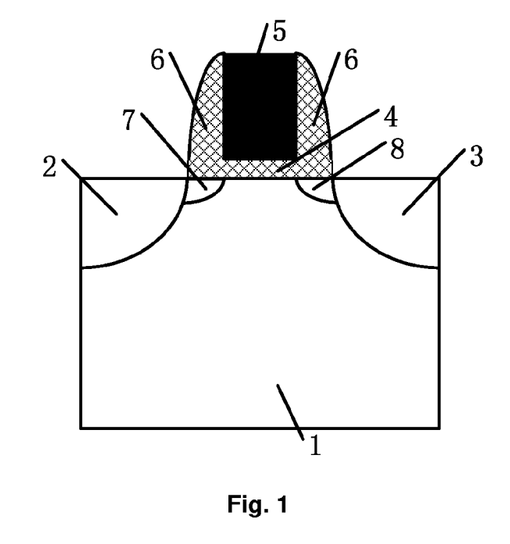
FIG. 1 is a schematic diagram of a structure of a typical field effect transistor, in which "1" denotes a bulk substrate, "2" and "3" denote source/drain regions, "4" denotes a gate oxide layer, "5" denotes a gate electrode, "6" denotes a sidewall, and "7" and "8" denote light doped source/drain (LDD) regions.
Figure 2A:
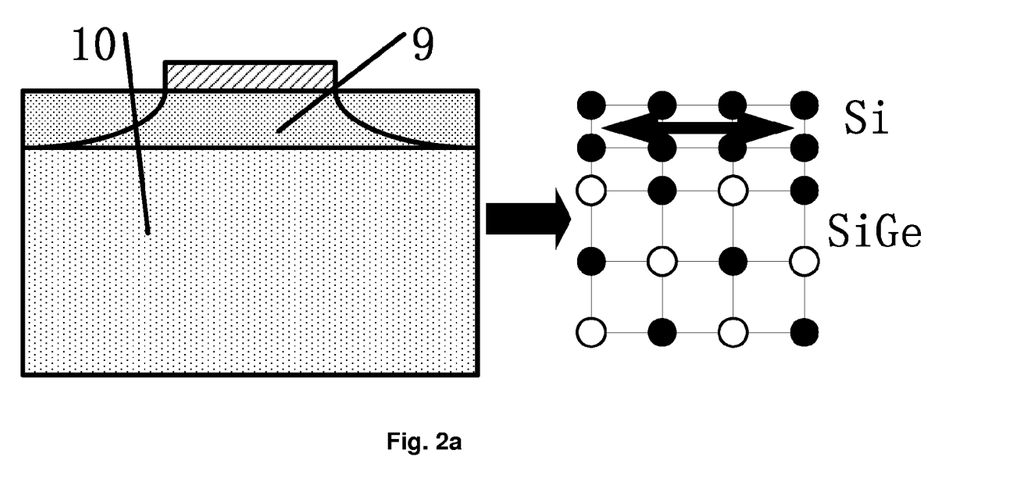
FIG. 2(a) illustrates a method using a heterojunction substrate.
Figure 2B:
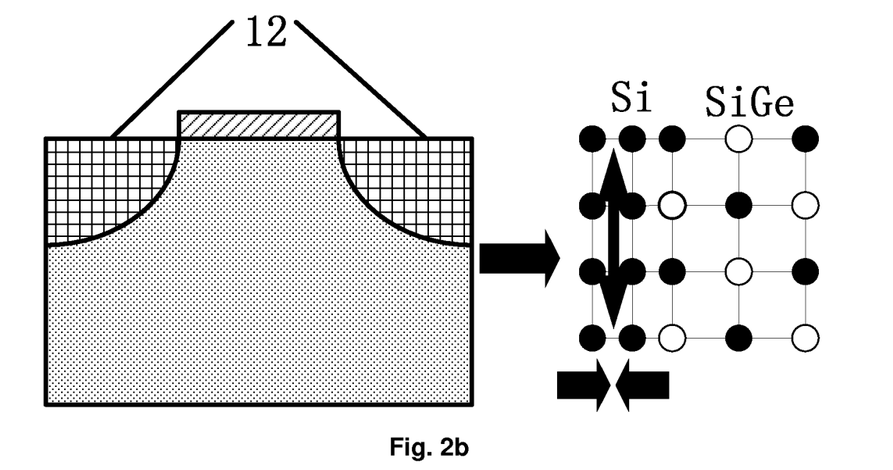
FIG. 2(b) illustrates a method using a heterojunction source/drain.
Figure 2C:
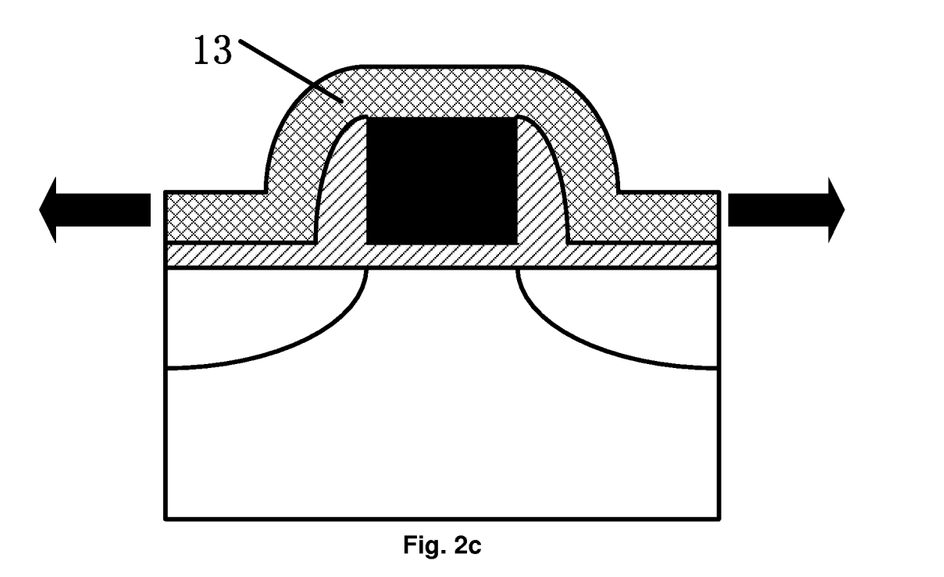
FIG. 2(c) illustrates a method using a covering stress layer.

The strain technology lies on that how to introduce a stress as needed by the device into the channel. A typical structure of a field effect transistor is shown in FIG. 1. Generally, with respect to such a device structure, conventional methods for introducing the stress mainly comprise following methods: 1) A strain is introduced by using a Si/SiGe heterojunction substrate; that is, as shown in FIG. 2(*a*), by using a non-silicon (non-Si) substrate, such as a SiGe substrate, a stress is introduced into a channel layer by using a difference between lattices of the substrate and the surface Si channel layer. At this time, lattices of the surface Si channel layer are stretched by lattices of SiGe of a lower layer because a lattice constant of SiGe is larger than that of Si, thus the stress is introduced into the Si channel. 2) A stress is introduced into the channel portion by using a heterojunction source/drain structure; that is, as shown in FIG. 2(*b*), by substituting the Si material in the source/drain regions with a non-silicon (non-Si) material, SiGe, for example, the stress is induced in the channel by heterojunctions between the source/drain and the channel. 3) A stress is introduced into the channel in the substrate by covering a highly strained layer on the device; that is, as shown in FIG. 2(*c*), a layer of highly strained film is applied on the device, and a strain of the film itself induces a strain in the device beneath the thin film, so that the stress is introduced into the channel.

It should be noted that, the foregoing methods do not substantially improve the device structure, and cannot effectively improve the capability for suppressing the short channel effect of the device itself.

SUMMARY OF THE INVENTION

An object of the present invention is to provide a method for introducing a stress into a channel of a field effect transistor, the method can introduce the stress into the channel of the transistor as needed for improving a performance of the device, and at the same time, can structurally ensure the field effect transistor device to have an excellent capability for suppressing the short channel effect.

The technical solutions of the present invention are described as follows.

A strained dielectric layer is interposed between a source/drain region and a substrate of a field effect transistor. A strain is induced in the channel by the strained dielectric layer which directly contacts the substrate, so as to improve the carrier mobility of the channel and performances of the device. The channel may be induced to produce a tensile strain by using the strained dielectric layer having a tensile strain, so as to improve the electron mobility, and the channel may be induced to produce a compressive strain by using the strained dielectric layer having a compressive strain, so as to improve the hole mobility.

The strained dielectric layer as described above isolates the source/drain region from the substrate, and thus the capability for suppressing the short channel effect of the device can be effectively improved.

The strained dielectric layer having a tensile strain as described above may comprise a silicon nitride having a tensile stress.

The strained dielectric layer having a compressive strain as described above may comprise a silicon nitride having a compressive stress or a diamond-like carbon having a compressive stress.

The silicon nitride having a tensile stress as described above may be obtained by using a plasma enhanced chemical vapor deposition (PECVD) with a low film deposition rate, lower than 250 Å/min, for example. Depositing the silicon nitride with a low rate may be achieved by methods such as reducing a radio frequency power of the PECVD reaction chamber, reducing a ratio of silane gas to nitrogen gas in the reactive gas, or the like. After the deposition of the silicon nitride film is completed, methods such as plasma processing, ultraviolet processing, or the like, can be used to break silicon-hydrogen bonds and nitrogen-hydrogen bonds in the silicon nitride film, so as to reduce the hydrogen concentration in the film, and thus further increase the tensile stress in the film.

The silicon nitride layer having a compressive stress as described above may also be obtained by performing a plasma enhanced chemical vapor deposition, wherein the compressive stress is realized by adding diluting gas into reactive gas. The typical diluting gas comprises mixed gas of argon and nitrogen, mixed gas of argon and hydrogen, or the like.

The diamond-like carbon having a compressive stress as described above may be obtained by methods such as physical vapor deposition (PVD) and chemical vapor deposition (CVD).

The thickness of the strained dielectric layer as described above may be in a range of 1 nm-200 nm.

Figure 3:
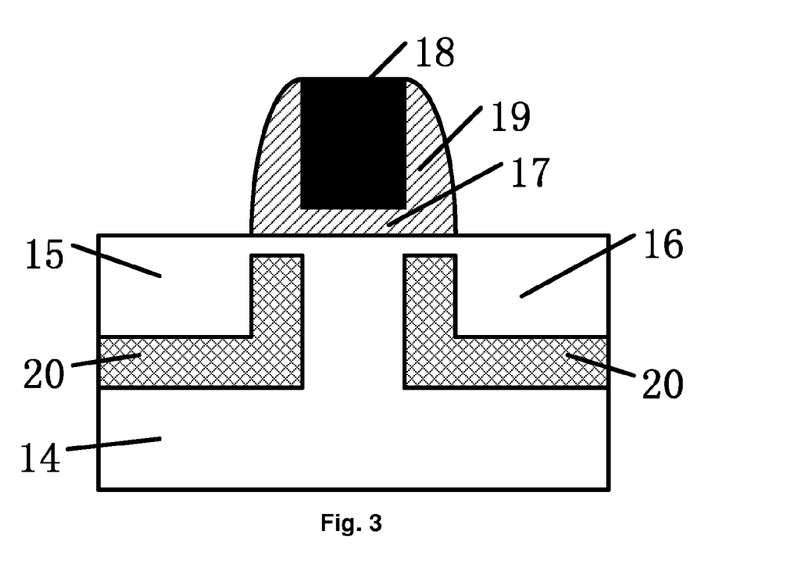
FIG. 3 is a device structure corresponding to the method for introducing stress according to the present invention.

FIG. 3 schematically illustrates a structure of a field effect transistor corresponding to said method. In FIG. 3, "14" denotes a substrate which may comprise a material such as silicon (Si), germanium (Ge), silicon-germanium (SiGe), gallium arsenide (GaAs), or the like; "15" and "16" denote source/drain regions; "17" denotes a gate dielectric layer which may comprise a material such as silicon dioxide, aluminum oxide, yttrium oxide, lanthanum oxide, hafnium oxide, titanium oxide, or the like; "18" denote a gate electrode which may comprise polysilicon, or metal material such as aluminium, tungsten, tantalum or the like, or metal nitride such as titanium nitride, tantalum nitride, or the like; "19" denotes a gate sidewall which may comprise material such as silicon oxide, silicon nitride, or the like; "20" denotes a strained dielectric layer which may comprise material such as silicon nitride having a tensile stress, silicon nitride or diamond-like carbon having a compressive stress, or the like.

Another object of the present invention is to provide a practical process of the method for introducing stress.

The process mainly comprises the following main steps:

1) etching grooves in source/drain region by using a silicon oxide sacrifice gate as a mask;

2) depositing a strained dielectric layer, and selectively etching the strained dielectric layer by using a polysilicon sacrificial source/drain as a protection layer;

3) performing an epitaxial growth by using exposed channel windows as seed crystal layers to obtain source/drain regions;

4) performing a light doped (LDD) implantation, and performing a source/drain implantation after depositing a silicon nitride protection layer;

5) depositing a thick silicon nitride layer, and performing a chemical mechanical polish until the silicon oxide sacrificial gate;

6) removing the silicon oxide sacrificial gate by selective etching, growing a gate dielectric layer, depositing a polysilicon layer, and performing a chemical mechanical polish to obtain a polysilicon gate.

The basic principles of the method are described as follows:

1) The present invention induces a strain in the channel by inserting a strained dielectric layer between the source/drain regions and the substrate region.

2) The channel stress can be modulated by adjusting an inner stress property of the strained dielectric layer to satisfy demands on stress required by various devices respectively. For example, a dielectric material having a tensile strain may introduce a tensile stress into the channel to increase the electron mobility of the N-type field effect transistor, while a dielectric material having a compressive strain may introduce a compressive stress into the channel to increase the hole mobility of the P-type field effect transistor.

3) The magnitude of the channel stress may be adjusted by adjusting the magnitude of the inner stress of the strained dielectric layer material and the thickness of the strained dielectric layer. The channel stress increases as the magnitude of the internal stress of the strained dielectric layer material and the thickness of the strained dielectric layer increase.

4) Because the strained dielectric layer isolates the source/drain region from the substrate, the short channel effect of the device may be effectively suppressed, and this facilitates the device downscaling.

As compared to conventional methods for introducing stress, the method according to the present invention may not only introduce channel stress, but also fundamentally improve the device structure of the field effect transistor, and therefore, can effectively improve the capability for suppressing the short channel effect of the device. The method for introducing stress as provided by the present invention has advantages over the conventional methods for introducing stress.

BRIEF DESCRIPTION OF THE DRAWINGS

FIG. 2 illustrates three conventional methods for applying stress used in the field of microelectronics fabrication industry at present, wherein

DESCRIPTION OF SPECIFIC EMBODIMENTS

The method for introducing stress provided by the present invention lies on introduction of a strained dielectric layer and a self-aligned process design. In a process, the strained dielectric layer, such as a highly strained silicon nitride or a diamond-like carbon, can only be obtained by deposition other than direct oxidization of a silicon substrate. Meanwhile, the present invention achieves a self-aligned fabricating process by using a polysilicon sacrificial source/drain and a silicon oxide sacrificial gate.

Figure 4A:
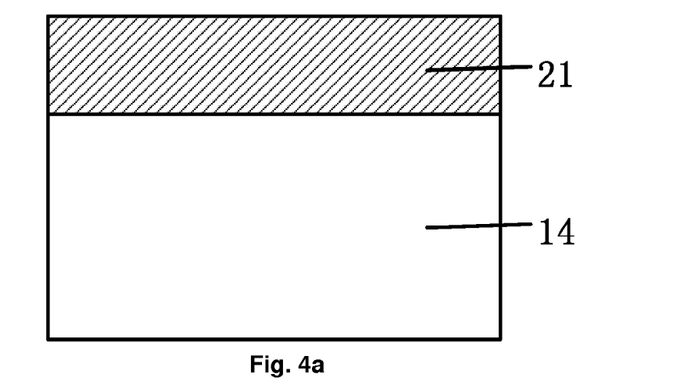
FIG. 4 is an example of a process corresponding to the method for introducing stress according to the present invention.
Figure 4B:
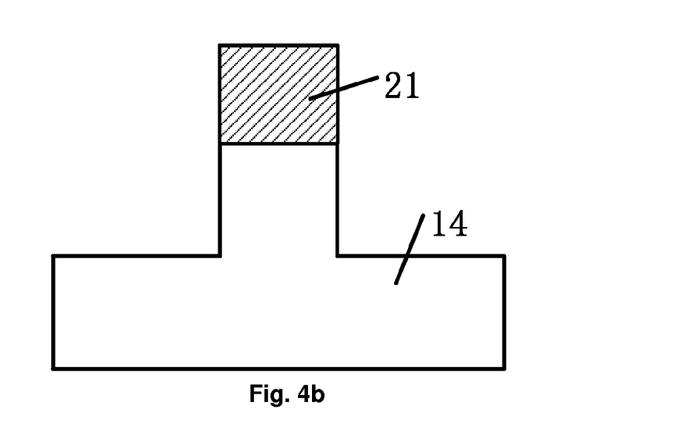
Figure 4C:
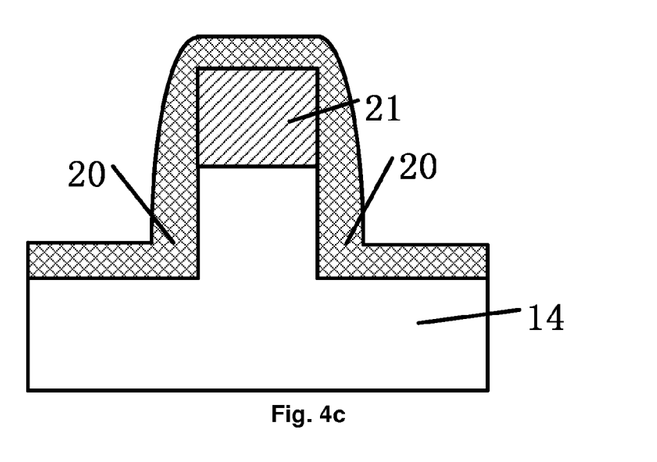
Figure 4D:
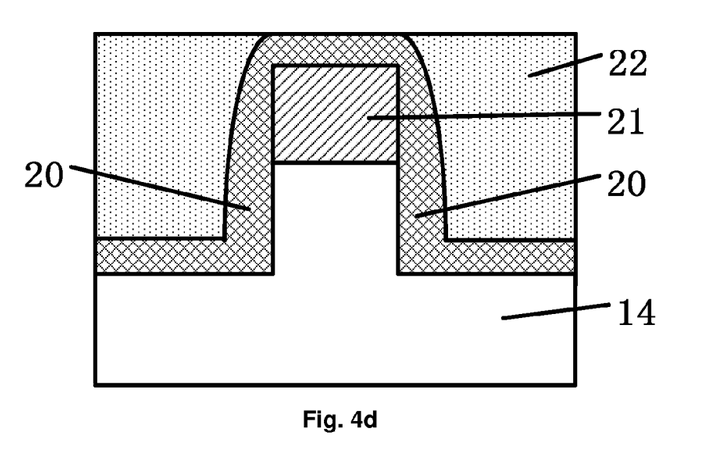
Figure 4E:
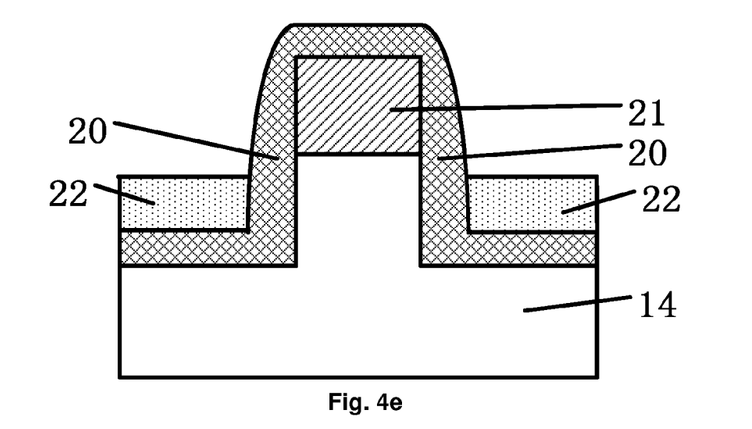
Figure 4F:
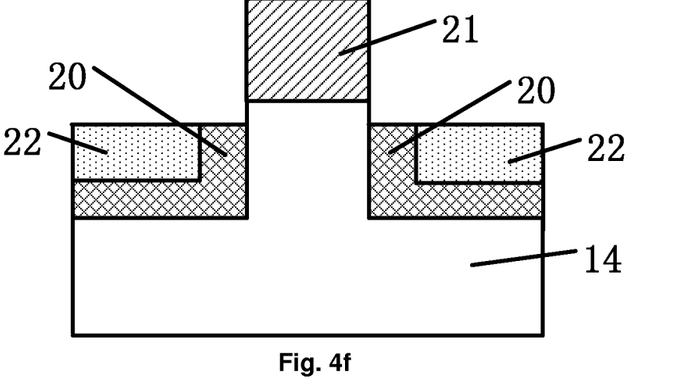
Figure 4G:
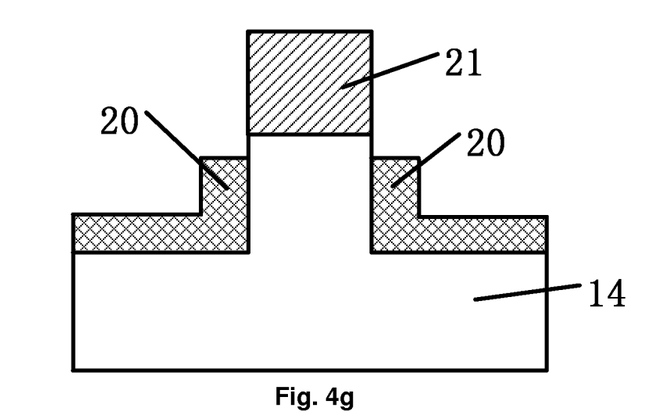
Figure 4H:
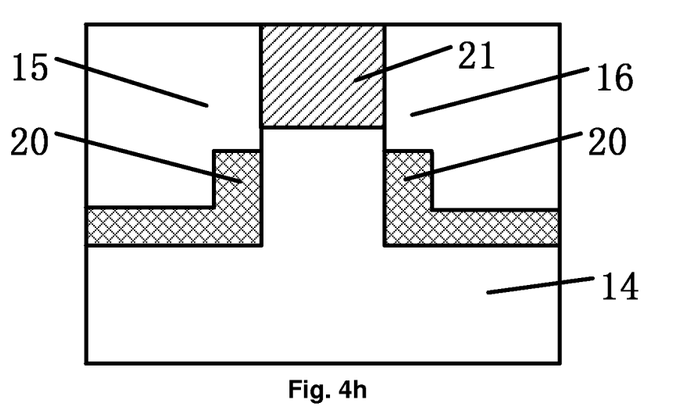
Figure 4I:
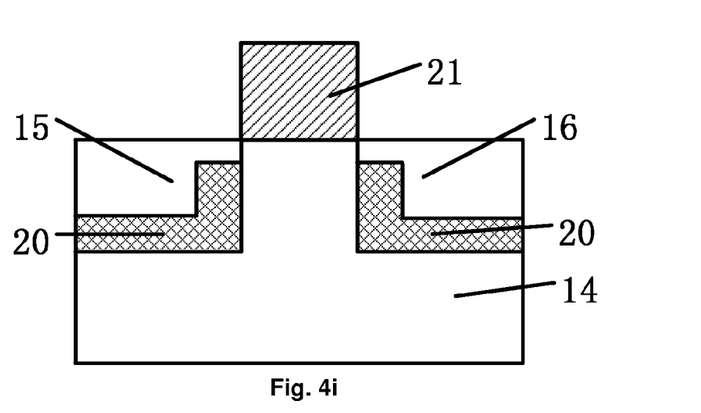
Figure 4J:
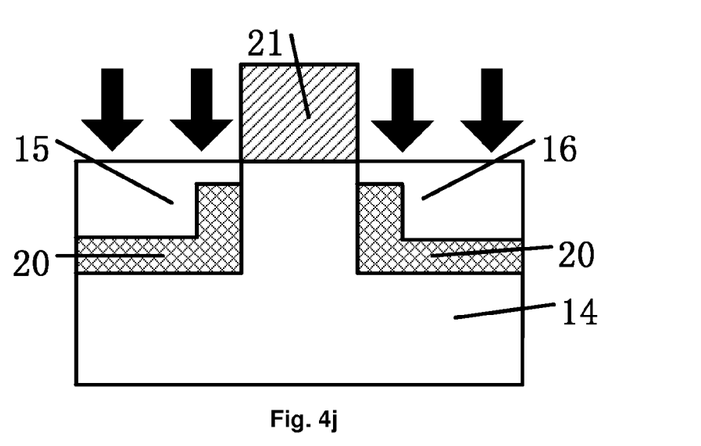
Figure 4K:
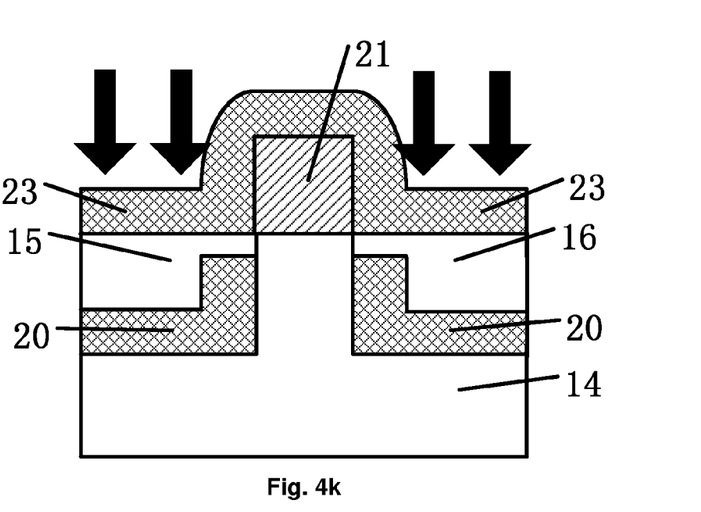
Figure 4L:
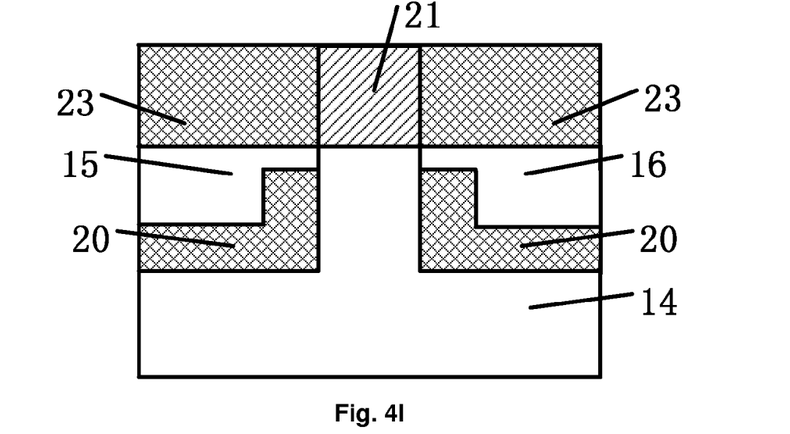
Figure 4M:
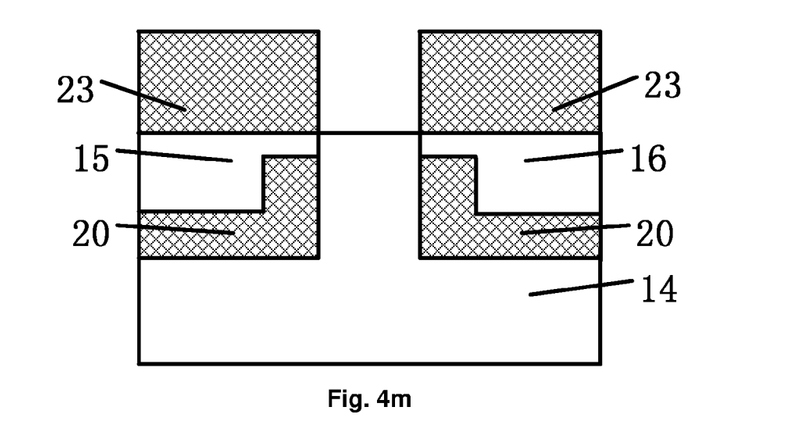
Figure 4N:
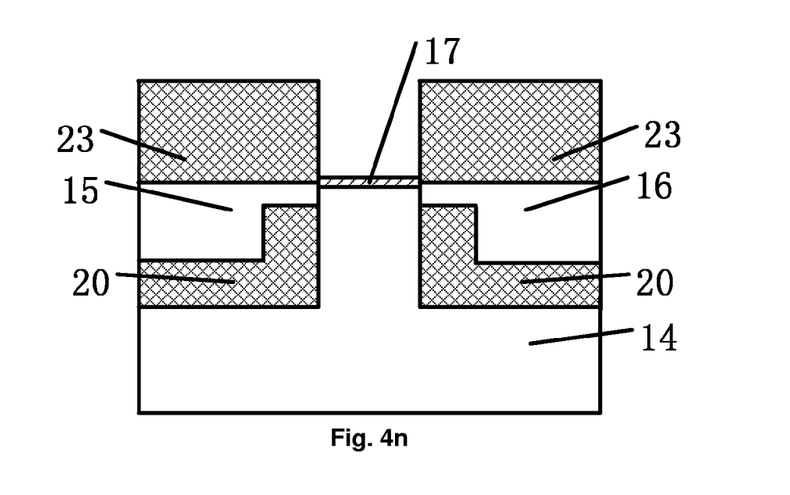
Figure 4O:
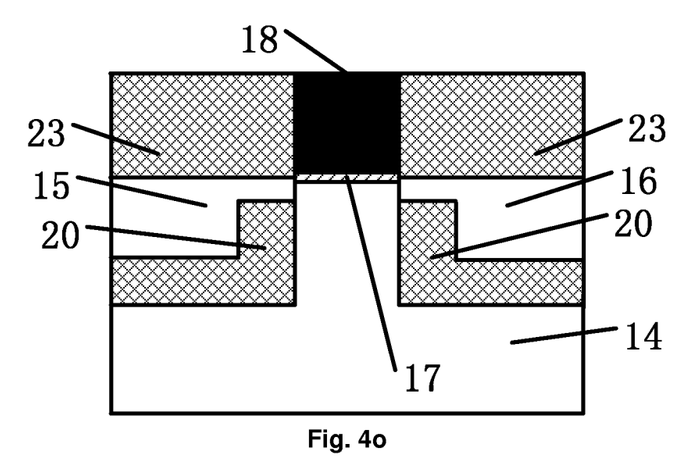

A specific embodiment of the method is shown in FIG. 4(a)-(o):

1) Performing a threshold adjust implantation to the substrate 14, and then depositing a silicon oxide sacrifice layer 21, wherein the thickness of the silicon oxide sacrifice layer 21 is determined by the height design requirement of the polysilicon gate, as shown in FIG. 4(a).

2) Performing a photolithography by using the gate mask, etching to get a silicon oxide dummy gate, further etching the substrate material to obtain source/drain grooves, wherein the depth of the source/drain grooves is determined by the height of a strained dielectric layer 20, as shown in FIG. 4(b).

3) Depositing the strained dielectric layer 20, wherein the thickness of the the strained dielectric layer 20 is determined by the designed thickness of the strained dielectric layer, as shown in FIG. 4(c).

4) Depositing a polysilicon sacrifice layer 22, and performing a chemical mechanical polish (CMP) process by using the strained dielectric layer 20 as a stop layer, as shown in FIG. 4(d).

5) Selectively etching the polysilicon sacrificial layer 22 until the position of the designed height of the strained dielectric layer 20, wherein the height between the surface of the strained dielectric layer 20 and the substrate surface of the channel region is the thickness of the light doped region (LDD region) which is determined by the design requirement, as shown in FIG. 4(e).

6) Selectively etching the strained dielectric layer 20 by using the polysilicon sacrificial layer 22 as a protection layer, as shown in FIG. 4(f).

7) Selectively etching and removing the sacrificial polysilicon layer 22, as shown in FIG. 4(g).

8) Performing an epitaxial growth by using windows in the channel region as seed crystal layers, and performing a chemical mechanical polish (CMP) process on the epitaxial layer by using the silicon oxide sacrificial gate as a stop layer so as to obtain source/drain regions 15 and 16, as shown in FIG. 4(h).

9) Etching the source/drain regions to remove unnecessary material of the source/drain regions until the height of the substrate surface of the channel, as shown in FIG. 4(i).

10) Performing a light doped (LDD) implantation, as shown in FIG. 4(j).

11) Depositing a low strained silicon nitride isolation layer 23 once more, wherein the thickness of the low strained silicon nitride isolation layer 23 is determined by the designed length of the light doped region (LDD region), and performing a heavy dose implantation to the source/drain regions 15 and 16, as shown in FIG. 4(k).

12) Continuing depositing a silicon nitride isolation layer 23, and performing a chemical mechanical polish (CMP) process on the silicon nitride layer 23 by using the silicon oxide sacrificial gate 21 as a stop layer, as shown in FIG. 4(l).

13) Selectively etching and removing the silicon oxide sacrificial gate 21, as shown in FIG. 4(m).

14) Forming a thin silicon dioxide layer 17 by low temperature thermal oxidation, wherein the thickness the thin silicon dioxide layer 17 is determined by the designed thickness of the gate oxide layer, as shown in FIG. 4(n).

15) Depositing a polysilicon layer, and performing a chemical mechanical polish (CMP) process by using the silicon nitride layer 23 as a stop layer to obtain a polysilicon gate 18, as shown in FIG. 4(o).

16) Performing a gate implantation and then performing a thermal annealing, and performing subsequent processes of contact hole photolithography and etching and metal deposition.

Finally, it is to be noted that, the purpose of the disclosure of the embodiments is to facilitate further understanding of the present invention. However, it will be apparent to those skilled in the art that various substitutions and modifications may be made without departing from the spirit and scope of the present invention as defined by the claims. Thus, the present invention should not be limited to the contents of the embodiments disclosed herein, and the scope to be protected by the present invention is defined by the claims.

What is claimed is:

1. A method for fabricating a field effect transistor, comprising the following steps:
    1) etching source/drain region grooves by using a silicon oxide sacrificial gate as a mask;
    2) depositing a strained dielectric layer that directly contacts the source/drain region grooves, and selectively etching the strained dielectric layer by using polysilicon sacrificial source/drain as a protection layer;
    3) performing epitaxial growth by using exposed channel windows as seed crystal layers to obtain source/drain regions;
    4) performing a light doped LDD implantation, depositing a silicon nitride layer, and performing a source/drain implantation by using the silicon nitride layer as a protection layer;
    5) depositing a thick silicon nitride layer, and performing a chemical mechanical polish until the silicon oxide sacrificial gate; and
    6) etching and removing the silicon oxide sacrificial gate, obtaining a gate dielectric layer, and depositing a polysilicon layer and performing a chemical mechanical polish to obtain a polysilicon gate.

2. The method according claim 1, wherein the strained dielectric layer comprising silicon nitride having a tensile stress is obtained by depositing silicon nitride through a low rate plasma enhanced chemical vapor deposition (PECVD) with a film deposition rate smaller than 250 Å/min.

3. The method according to claim 1, wherein the strained dielectric layer comprising silicon nitride having a compressive stress is obtained by depositing silicon nitride through a plasma enhanced chemical vapor deposition (PECVD) with diluting gas being added into reactive gas.

4. The method according to claim 1, wherein the strained dielectric layer comprising diamond-like carbon having a compressive stress is obtained by a physical vapor deposition (PVD) or chemical vapor deposition (CVD) method.

* * * * *